United States Patent [19]
Oldford

[11] 4,020,243
[45] Apr. 26, 1977

[54] ELECTRICAL MEASURING SYSTEM FOR TESTING ELECTRICAL COMPONENTS

[76] Inventor: William G. Oldford, 4944 Lakeshore Road, Lexington, Mich. 48450

[22] Filed: Oct. 31, 1975

[21] Appl. No.: 627,691

Related U.S. Application Data

[63] Continuation of Ser. No. 453,850, March 22, 1974, abandoned.

[52] U.S. Cl. .................................. 429/93; 324/29.5
[51] Int. Cl.² ........................................ H01M 2/10
[58] Field of Search .................. 136/182, 132, 173; 324/29.5; 340/249; 429/93

[56] References Cited

UNITED STATES PATENTS

| | | | |
|---|---|---|---|
| 2,853,676 | 9/1958 | Ellis | 324/29.5 |
| 2,856,449 | 10/1958 | Coler | 136/132 |
| 3,157,870 | 11/1964 | Marino et al. | 136/182 |
| 3,327,107 | 6/1967 | Gey | 136/182 |
| 3,823,367 | 7/1974 | Kaye et al. | 324/29.5 |

*Primary Examiner*—Donald L. Walton

*Attorney, Agent, or Firm*—Harness, Dickey & Pierce

[57] ABSTRACT

An electrical measuring system for testing electrical components to receive a specially wrapped package containing the component to be tested, the console including a meter or other indicating system for providing an indication of the voltage characteristic of the component. The console includes a provision for testing different voltage components, for example, one and one-half, nine and thirty-five volt components, and the output indication of the voltage level of the component may be by meter needle or by a light system. The component is specially packaged in a container having a tab portion formed thereon, the component being packed with a film-like conductors which are led to the tab, the tab portion being adapted to be inserted into the test console. In certain circumstances, the tab portion is adapted to be varied in length depending on the voltage of the component packaged therein, the variation in length being utilized to switch the console circuitry to accommodate different voltages.

12 Claims, 17 Drawing Figures

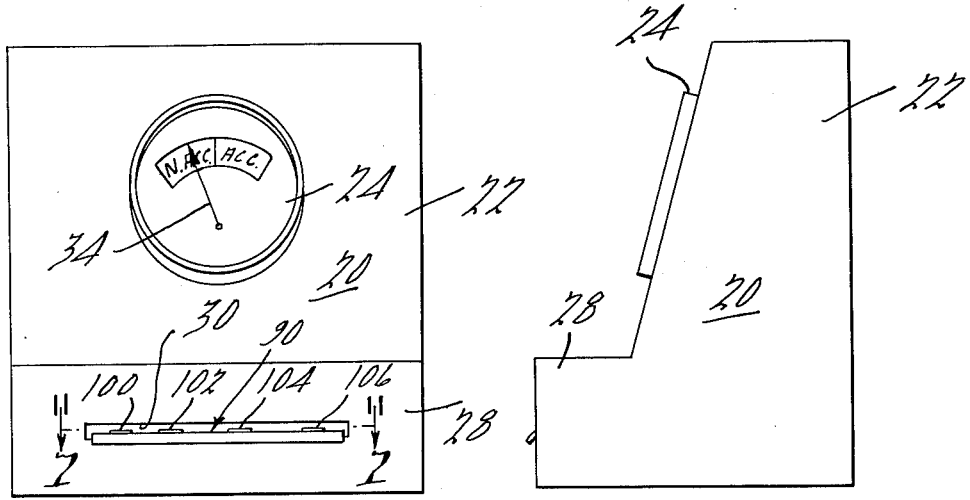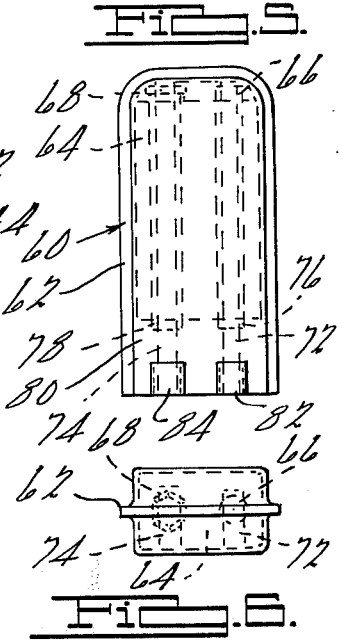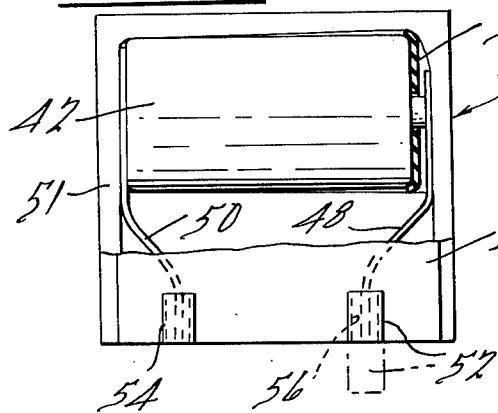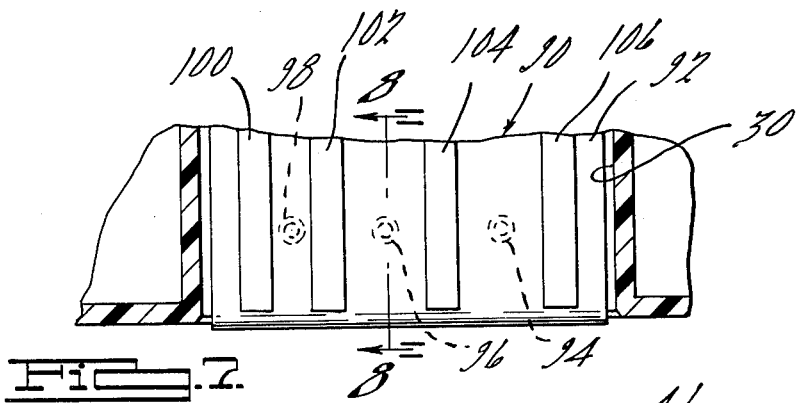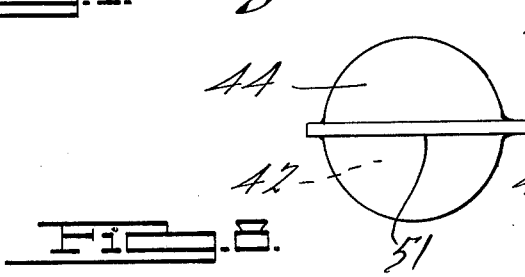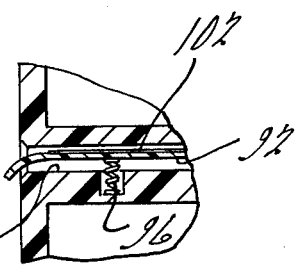

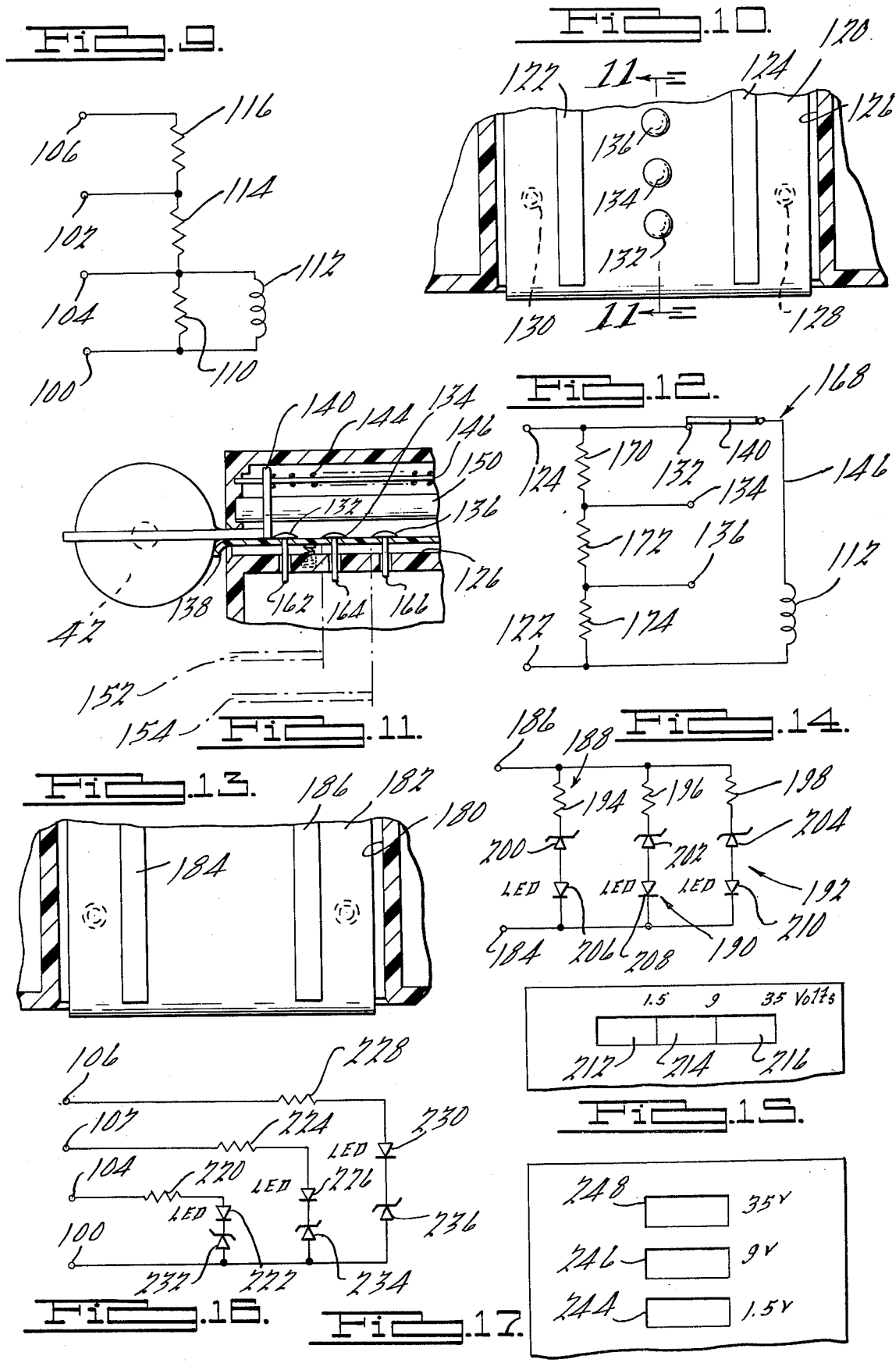

ELECTRICAL MEASURING SYSTEM FOR TESTING ELECTRICAL COMPONENTS

PRIOR APPLICATION

This application is a continuation of an application of William G. Oldford, Ser. No. 453,850, filed Mar. 22, 1974 now abandoned.

BACKGROUND AND SUMMARY OF THE DISCLOSURE

This invention relates generally to a power supply voltage indicating system and more particularly to a system for indicating the state of charge of a battery which has been packaged in a special wrapper having connections to the exterior of the package from the terminals of the battery.

In packaging and merchandising batteries, for example, dry cell batteries, it has been found desirable to wrap each individual storage battery in individual containers. It has further been found desirable to provide a means for the prospective purchaser or user to test the battery to determine whether the voltage level of the battery is above certain standards. In this way the purchaser is insured of buying a fresh battery and the manufacturer thereof is insured that every battery which is sold is tested prior to purchase and thus the good will developed in the trade name used by the various battery manufacturers is maintained. It is the problem of packaging the battery and providing external leads for the battery for testing, and the apparatus for testing the battery with which this invention is concerned.

Referring first to the methods of packaging the battery contemplated by the principles of the present invention, the battery is packaged in a transparent film forming a covering for the battery and suitable leads are provided within the package for providing an external connection from the terminals of the battery to an external testing console. In the preferred embodiment of the invention, the battery package is provided with an elongated tab portion which projects from the main body of the package, the tab portion being utilized to position the external connections within the console and thus energize the circuitry within the battery testing console. The conductors provided within the battery package which are to be used as external leads are positioned adjacent the battery terminals and in contact therewith and the remaining portion of the external leads are directed through the interior of the tab portion to a position on the tab portion adjacent the edge thereof. This edge is then altered to expose the ends of the external leads.

The battery situated within the package is provided with non-conductive strips to insure that the two external leads of the package connected to the terminals of the battery are not short-circuited and a suitable stiffening may be provided. The packaging assembly of the present invention is particularly suitable for providing a desiccant in the package to reduce the moisture content within the package. In this way leakage current is minimized to minimize the discharge of the battery during the shelf life of the battery.

As will be seen from a further description of the assembly, it is contemplated that the positioning of the above described external conductors within the package will be varied, in certain instances, in accordance with the voltage of the battery to be tested. In this way, and by suitably designing the test console, various types of batteries having varying voltages may be tested in the same console by merely inserting the tab portion of the package into the console. Thus, the position of the external conductor within the package will determine the particular circuitry within the test console which will be actuated to test the battery of a particular voltage. As was described above, in certain other contemplated console configurations, the length of the package tab would be varied to actuate selected circuitry within the test console in accordance with the voltage of the battery to be tested. Under these circumstances, it is contemplated that the external conductors will be positioned uniformly in each of the packages, irrespective of battery voltage to be tested.

In one preferred embodiment of the test console, a housing for the internal circuitry and indicator device of the console will be positioned within a housing, the housing being adapted to be bolted to a display counter or other suitable position adjacent a battery display or storage area. In the preferred embodiment, the housing is generally L-shaped with the indicator device, whether the indicator be a meter or other suitable visual display, being mounted on the generally vertical face thereof. The horizontal portion is provided with a slot into which the tab portion of the package may be inserted. Suitable conductive strips are positioned within the portion of the housing contiguous with the slot to connect to the external conductors formed within the package and a suitable switching arrangement has been provided for switching the scale of the meter in the case where a variable length tab portion is provided. In the preferred embodiment, the variable length tab portions are utilized with a meter indicator. In the case where lamp indicators have been provided, suitable circuitry has been devised to energize various combination of lamps to provide an indication of the battery voltage. On the other hand, another system of lamp indication has been provided where the position of the external leads within the package is varied to vary the circuit which is energized within the console. The determination of which circuit is energized will determine which lamp is lit to indicate the battery voltage.

Accordingly, it is one object of the present invention to provide an improved packaging system for power supplies.

It is another object of the present invention to provide an improved packaging system for dry cell power supplies.

It is still another object of the present invention to provide an improved packaging system for power supply systems of the storage battery type which are adapted to be tested by an external tester without unwrapping the power supply.

It is still a further object of the present invention to provide an improved packaging system for a power supply wherein external conductors are provided for connecting the power supply to an external tester, the tester being adapted to test batteries of different voltages.

It is still another object of the present invention to provide an improved packaging system for power supplies having external conductors of the type described above wherein the position of the conductors is varied depending on the voltage of the power supply being tested.

It is still another object of the present invention to provide an improved power supply packaging system having external leads formed within the package for connecting the terminals of the power supply to an external tester, the package being devised to adjust the power supply tester to accommodate various power supplies of different voltages.

It is still another object of the present invention to provide an improved power supply packaging apparatus which is inexpensive to manufacture, easy to assemble, attractive in its display and reliable in use.

It is a further object of the present invention to provide an improved power supply test apparatus.

It is still a further object of the present invention to provide an improved power supply test apparatus which is capable of receiving a power supply incorporated within a package of the type described above for providing an indication of the voltage of the power supply.

It is still a further object of the present invention to provide an improved power supply test apparatus which is capable of testing power supplies of different voltages, the package and the power supply test apparatus being devised to interact for switching the range of the power supply tester.

It is still another object of the present invention to provide an improved power supply test apparatus which is particularly adapted to be mounted adjacent a power supply display or storage area wherein the prospective purchaser or user may test each individual power supply before it is purchased.

It is still another object of the present invention to provide an improved power supply test apparatus which incorporates a switching assembly within the apparatus which coacts with the power supply package to switch the range of the indicator of the power supply test apparatus.

It is still another object of the present invention to provide an improved power supply test apparatus which includes circuitry for automatically switching the range of the test apparatus for selected voltages to provide an indication of the voltage level of a power supply irrespective of the maximum voltage of the power supply.

It is a further object of the present invention to provide an improved power supply test apparatus which is inexpensive to manufacture, reliable in use and provides a means for an inexperienced purchaser or user to test the voltage of the power supply.

Further objects and features of the invention will become apparent upon considering the following specification and the attached drawings, in which:

FIG. 1 is a front elevation view of a preferred form of test apparatus incorporating the features of the present invention;

FIG. 2 is a side view of the test apparatus of FIG. 1;

FIG. 3 is a preferred form of packaging assembly for a one and one-half volt "D" cell which incorporates certain features of the present invention;

FIG. 4 is a side view of the packaging apparatus of FIG. 3;

FIG. 5 is a view of a packaging apparatus particularly adaptable for use in packaging nine volt dry cell power supplies with a portion thereof shown in dotted lines;

FIG. 6 is a top view of the packaging apparatus of FIG. 5;

FIG. 7 is a cross-sectional view partially broken away, of FIG. 1 taken along line 7—7 thereof, of the conductive strips incorporated in the slot of FIG. 1, which slot is adapted for use in receiving the tab portion of the power supply package;

FIG. 8 is a cross-sectional view taken along line 8—8 of FIG. 7 particularly illustrating the insertion of a tab portion of a one and one-half volt "D" cell package into the slot of the test apparatus of FIG. 1;

FIG. 9 is a schematic diagram illustrating the circuitry adapted to be utilized in conjunction with the apparatus of FIGS. 7 and 8;

FIG. 10 is a plan view, partially broken away, of the conductive strips incorporated in a modified form of the console of FIG. 1;

FIG. 11 is a cross-sectional view taken along line 11—11 of FIG. 10 and particularly illustrating the varying length tab portions utilized in packages incorporating power supplies having different voltages and further illustrating the switching arrangement for varying the range of the indicator system of the test apparatus;

FIG. 12 is a schematic diagram illustrating the circuitry incorporated in the modified console such as the type illustrated in FIGS. 10 and 11;

FIG. 13 is a plan view, partially broken away, of the conductive strips incorporated in a further modification of the console of FIG. 1 wherein the display apparatus includes a plurality of lamps or light emitting diodes;

FIG. 14 is a schematic diagram illustrating a preferred form of circuitry which is adapted to be interconnected with the conductive strips of FIG. 13;

FIG. 15 is a view of the display portion of a modified console such as described in FIGS. 13 and 14;

FIG. 16 is a schematic diagram of a further modified console wherein the console includes a plurality of conductive strips such as disclosed in FIG. 7; and FIG. 17 is a preferred form of display apparatus for use in conjunction with the circuitry described in FIG. 16.

DETAILED DESCRIPTION OF THE PREFERRED EMBODIMENTS

Referring now to FIG. 1, there is illustrated a preferred form of battery testing console 20 which is generally formed in an L-shaped configuration, the vertical leg 22 thereof forming the mounting for a meter 24, or other display device, and a horizontal portion 28. The horizontal portion 28 is provided with a slot 30 which is adapted to receive a tab portion of the power supply package to be described hereinafter, for example see the description of FIGS. 3 to 5. As will be seen from a description of FIGS. 3 to 5, the package is formed with a tab portion which is inserted into the slot 30 and a conductive path is completed between the battery to be checked and the circuitry which is associated with the console 22 for energizing the meter 24. The meter 24 is preferably provided with a scale having an area provided with the indicia illustrated. That is, the meter will indicate whether the battery is not acceptable or acceptable, a dividing line being provided which is positioned such that a needle 34 will exceed the position indicated by the line when the battery is of sufficient or acceptable voltage.

Referring now to FIGS. 3 and 4, there is illustrated a preferred form of packaging assembly 40, the assembly of FIGS. 3 and 4 being utilized for packaging a one and one-half volt "D" cell. Specifically, a "D" cell 42 is enclosed within a plastic wrapper 44, the wrapper being formed to closely fit around the body of the cell 42. The wrapper is elongated to form a tab portion 46, the tab portion being adapted to be inserted into the slot 30 described in conjunction with FIG. 1. In inserting the tab portion 46, the package should be kept to the extreme left of the slot to insure proper contact of the mating conductors and suitable indicia may be provided to caution the user. The interior of the package 44 includes, in addition to the battery 42, a pair of conductive strips 48, 50 which are adapted to be positioned in contact with the positive and negative terminals of the battery 42. The strips 48, 50 form the external connectors which are positioned in electrical connection with a pair of conductive strips associated with the mechanism positioned in slot 30, this mechanism to be more fully described hereinafter. The upper end of the battery is provided with suitable insulation 58 to preclude shorting the strips 48, 50 through the battery case.

The conductive strips 48, 50, in addition to being connected to the terminals of the battery 42, are led to an edge portion of the tab portion 46. The outer rim of the container 44 is formed as a flat flange 51, the container 44 being formed as two parts which are mated together and suitable heat treated to cause the upper and lower portions of the housing to adhere, one to the other. By maintaining the extent of the cavity in which the battery 42 is placed very close to the dimensions of the battery, the connectors 48, 50 will be positioned in contact with the terminals of the battery. Additionally, suitable conductive grease may be used to insure a good connection between the battery terminals and the strips 48, 50.

The lower half of the housing 44 is formed with a pair of projection tabs 52, 54 which are adapted to be folded over a cutaway area 56 formed in the upper half of the housing 44. The tabs 52, 54 are adapted to be pulled down to expose the conductors 48, 50 when it is desired to test the battery.

Referring now to FIGS. 5 and 6, there is illustrated a preferred form of package for a 9 volt battery commonly used in conjunction with transistorized circuits such as portable radios and the like. The package is similar to the package described in conjunction with FIGS. 3 and 4 and includes a wrapper 60 which is also formed of an upper and lower half. The edges of the housing are again formed with a rim portion 62 on both the upper and lower halves, which rim portions are suitably heat treated to cause them to adhere, one to the other. The package encloses a 9 volt battery 64 having a pair of closely spaced terminals 66, 68, as is commonly found on batteries of this type. The package includes a pair of conductors 72, 74 which are similar to the conductors 48, 50 in that they are fabricated of foil stirps which are connected to the terminals 66, 68. In view of the fact that the conductors 72, 74 are mounted adjacent to the case of the battery 64, suitable insulating material 76, 78 is positioned between the conductors 72, 74 and the casing of the battery 64.

As was the case with FIGS. 3 and 4, the assembly 60 is provided with a tab portion 80 which is adapted to be inserted into the slot 30. The tab portion is also formed with a pair of removable tabs 82, 84 which, when removed, expose the conductors 72, 74 for conductive association with corresponding strips in the console 20. Again, the tab portion must be kept to the extreme left within the slot 30 to insure proper mating of the console conductors with the external conductors 72, 74. As was the case with the assembly of FIGS. 3 and 4, the tab portion 80 is adapted to be inserted into the slot 30.

The purpose for the difference in dimension of the tab portions 46 and 80 will be discussed in conjunction with the detailed description of FIGS. 7 and 8.

Referring now to FIGS. 7 and 8, there are illustrated the details of an apparatus 90 which is adapted to engage and electrically connect to the tab portion, and particularly the conductors contained therein. The apparatus 90 generally includes an insulating plate 92, having a portion thereof projecting from the slot 30, the plate 92 being resiliently biased upwardly by means of a plurality of spring elements 94, 96 and 98. The spring elements resiliently bias the plate 92 to firmly engage the tab element of the package assembly inserted therein.

The plate member 92 has affixed thereto a plurality of conductive strips 100, 102, 104, 106, the strips being insulated, one from the other, by means of the non-conductive plate 92. The strip 100 is designated the common conductor, whereas the strips 102, 104 and 106 correspond to the nine volt, one and one-half volt, and thirty-five volt terminals, respectively. It will be noted that the spacing between the strips 100 and 102 correspond to the spacing between the conductors 72, 74 in the case of the nine volt battery described in conjunction with FIGS. 5 and 6 and the spacing between the strips 100 and 104 correspond to the spacing between the conductors 48 and 50 of the one and one-half volt battery described in conjunction with FIGS. 3 and 4. The 35 volt battery assembly, not illustrated, would be formed with a package having a pair of external conductors formed therein, the spacing between the conductors corresponding to the spacing between the conductors 100, 106.

FIG. 8 illustrates the manner in which the tab portion of the one and one-half volt battery is inserted into the slot 30 and into engagement with the plate 92. With the battery inserted therein, the conductor 50 will engage the conductor 104 and the conductor 48 will engage the conductor 100. This will form the connections between the battery 42 and the electrical circuit of the meter 24 to energize the meter in accordance with the voltage of the battery being tested. Similarly, the conductor 82, in the case of the nine volt battery, will engage the conductor 100 upon insertion of the tab portion 80 into the slot 30 and the conductor 74 will engage the conductor 102. This will connect the nine volt battery to the indicator apparatus.

Referring now to FIG. 9, there is illustrated the electrical circuitry contained within the horizontal portion 28, and particularly the circuit connected to the terminals 100, 102, 104 and 106. For purposes of simplicity, the conductors 100 through 106 are indicated as input terminals and it is to be noted that the designation of the particular terminals corresponds to the position of the terminals in the circuit rather than the position of the terminals on the conductive plate 92. This is done in order to simplify the circuitry. The one and one-half volt terminal 104, in conjunction with the common terminal 100, develops a voltage across a resistor 110, the resistor being connected in parallel with a coil 112 of the meter 24. Accordingly, when the one and one-half volt battery is connected across the terminals 100, 104, the voltage of the battery will be developed across the resistor 100 and this across the coil 112. If the voltage is sufficiently high, approximately one and one-half volts, the meter will be sufficiently energized to deflect the needle 34 to full scale deflection. If the voltage is slightly less than one and one-half volts, the needle will not be deflected to its maximum but will be deflected to a position above the dividing line between not acceptable and acceptable on the meter scale. If the voltage is too low to swing the needle beyond the dividing line illustrated on the meter 24, the needle will indicate the battery is not acceptable.

In the case of the nine volt battery, the tab portion will connect the nine volt external connections 72, 74 to the terminals 100, 102, respectively. With these connections, a nine volt potential will be developed across a series circuit including a resistor 114 and the resistor 110. However, the resistor 114 is selected to be five times the value of the resistor 110 so that seven and one-half volts will be developed across resistor 114 and one and one-half volts will be developed across resistor 110 in the situation where nine volts are impressed across terminals 100 and 102. This will cause full scale deflection of the needle of meter 24 if a full nine volts is connected across the terminals 100, 102. Again, if the battery voltage is sufficiently low to render the battery non-acceptable, the voltage developed across resistor 110 will be sufficient to swing the needle 34 across the line dividing the non-acceptable and acceptable portions of the meter 24. This will indicate to the purchaser that an insufficient voltage is being developed across the battery terminals.

A similar situation exists in the case of the 35 volt terminal 106. When the 35 volt battery tab portion is inserted into the slot 30, the external connections of the battery packaging assembly will be connected to terminals 100, 106. The 35 volt battery will then develop a voltage across a resistor 116, and the resistors 114 and 110. In this case, the resistor 116 is selected to be approximately, and actually slightly less than, eighteen times the value of the resistor 110, and the voltage developed across the resistors 116, 114 and 110 will be approximately 35 volts with 35 volts impressed across terminals 100 and 106. This 35 volts will develop a one and one-half volt drop across resistor 110 which will cause full scale deflection of the needle 34 due to the energization of the coil 112.

Referring now to FIGS. 10, 11 and 12, there is illustrated a modified form of the invention wherein a plate 120, corresponding to plate 92, is provided with a pair of conductors 122, 124 in lieu of the four conductors 100 through 106. Again, the plate 120 is resiliently biased upwardly in a slot 126, corresponding to slot 30, by means of a plurality of spring elements 128, 130. The plate member 120 is also formed with three spot conductors 132, 134, 136 which are provided for a purpose to be explained hereinafter. The assembly of FIGS. 10, 11 and 12 is adapted to be utilized in conjunction with a packaging assembly which is provided with tab portions having varying lengths depending on the voltage of the battery being tested and packaged, the varying length tab portions being used for switching the internal circuitry of the console 20 to vary the scale of the meter.

Referring now to the details of FIG. 11, which illustrates the one and one-half volt battery package assembly in full line and the nine and thirty-five volt battery tab portions in phantom, it is seen that the slot 126 also includes a slidable switch finger 140 which is engageable by the end of a tab portion 138 to position the switch finger into contact with the first terminal 132. The second and third terminals 134, 136 remain open circuited. The switch finger 140 is resiliently biased outwardly by means of a spring element 144 concentrically mounted on a rod 146. The rod 146 also passes through an aperture in the switch finger 140 to support the switch finger 140 in the proper position. A suitable guide 150 is provided to guide the switch finger 140 along the rod 146 and a conductor (not shown) is connected to the finger 140 to affect the proper connections. The relative lengths of a nine volt tab portion 152 and a 35 volt tab portion 154 are illustrated in phantom at the bottom of the picture.

The contact areas 132, 134, and 136 are provided with terminal elements 162, 164, 166 to provide the necessary connections to the circuit to be described in conjunction with FIG. 12 wherein it will be seen the manner in which the meter circuitry is switched to accommodate the different voltages of various size batteries to be tested.

Referring now to FIG. 12, the connections between the strip conductors 122 and 124 and a preferred meter circuit 168 is illustrated. When the battery package, particularly the tab portion 138 thereof, is inserted into the slot 126, the external connections on the battery package will be equally spaced irrespective of the size of the battery being tested. The difference between the battery packages will be evidenced in the length of the tab portion as illustrated in FIG. 11. When the battery is inserted into the slot 126, a voltage will be developed across a plurality of resistors 170, 172, 174 in accordance with the voltage of the battery being tested. For example, if a one and one-half volt battery is inserted into the slot 126, the entire one and one-half volts will be developed across the combination of the series resistors 170, 172 and 174. Under this condition, the one and one-half volts will be developed across the conductors 122, 124, this voltage being utilized to deflect the meter needle 34 in response to the energization of the meter coil 112.

With the one and one-half volt battery inserted, the finger switch 140 will be positioned to be in engagement with the contact 132. This will connect the one and one-half volts across the meter coil 112. In the case of the nine volt battery, the nine volts is again developed across the resistors 170, 172 and 174. However, the finger switch 140 will be moved into contact with the conductor area 134 to connect the meter coil 112 across the resistors 172, 174. On the other hand, if a 35 volt battery is inserted, the finger switch 140 will be moved into contact with the conductor area 136.

Accordingly, the resistor values 170, 172, 174 are selected such that when a nine volt battery is connected across teminals 122, 124, one and one-half volts will be developed across resistors 172, 174. On the other hand, if a 35 volt battery is connected across terminals 122, 124, one and one-half volts will be developed across resistor 174. In this manner, the needle will be deflected full scale for the respective voltages of the batteries being tested.

For example, the resistive values of resistors 170, 172 and 174 could be selected to be 20 ohms, 3 ohms, and 1 ohm, respectively. Thus, with 35 volts connected across terminals 122, 124, there will be approximately one and one-half amperes flowing through the series resistors 170, 172, 174. With one and one-half amperes flowing through resistor 174, and resistor 174 being one ohm, there will be one and one-half volts developed between terminals 122 and 136. This will deflect the needle full scale in response to the energization of the coil 112. On the other hand, if nine volts is connected across terminals 122 and 124, there will be three-eights of an ampere flowing through resistors 170, 172 and 174. With three-eights of an ampere flowing through resistors 172 and 174 (three and one ohms, respectively), there will be one and one-half volts developed across terminals 134 and 122. This will again provide full scale deflection of the needle 34 in response to the energization of the coil 112.

Referring now to FIGS. 13, 14 and 15, there is illustrated a further modified form of the system of the present invention. In this case, the varying length tab portions described in conjunction with FIGS. 10, 11 and 12 are not utilized. However, the uniform spacing between the external connections irrespective of the voltage of the battery is utilized. Accordingly, a slot 180 is again provided with a non-conductive plate 182 which includes a pair of strip conductors 184, 186 attached to the face thereof. Again, the tab portion of a battery package is inserted into the slot 180 such that the external conductors provided therein are placed in conductive engagement with the conductors 184, 186. However, in the case of the modified form of the invention of FIGS. 13 through 15, the varying of the indication in response to battery voltage is accomplished eldctrically. In this particular embodiment, lamps are illuminated in response to the magnitude of the voltage being tested.

Referring specifically to the circuit details of FIG. 14, it is seen that the battery voltage is impressed across terminals 184, 186. The circuit is provided with a plurality of parallel indicating circuits 188, 190, 192 corresponding to the one and one-half volt, nine volt and 35 volt batteries to be measured. Each of the circuit contains one each of a set of current limiting resistors 194, 196, 198, zener diodes 200, 202, 204 and light emitting diodes 206, 208 and 210.

In each case, the zener diode is selected to have an avalanche voltage approximately equal to the lower acceptable voltage limit for the battery to be tested. For example, the one and one-half volt battery may have an unacceptable voltage limit of one and four-tenths volts. Accordingly, the zener diode 200 will be selected to be approximately one and four-tenths volts such that when one and four-tenths volts is impressed across terminals 184, 186, the zener diode 200 will switch to its avalanche state to cause conduction through the series circuit including resistor 194, zener diode 200 and light emitting diode 206. This will cause light emitting diode 206 to be enerigized. On the other hand, if nine volts is impressed across conductor terminals 184, 186, the diode 200 will avalanche as will the diode 202 if its avalanche voltage is selected to be approximately eight and six-tenths volts. In this case, eight and six-tenths volts is selected as the lower limit of an acceptable voltage for a nine volt battery. Thus, the light emitting diode 208 will also be illuminated in addition to the illumination to the diode 206. A similar situation occurs if a 35 volt battery is impressed across terminals 184, 186. In this case, the diode 204, if its avalanche voltage is selected to approximately 35 volts, will permit conduction through the light emitting diode 210. Thus, with a 35 volt battery connected across terminals 184, 186, the entire array of light emitting diodes 206, 208 and 210 will be illuminated.

A preferred display to indicate the satisfactory condition of the various batteries is illustrated in FIG. 15. In this case, the light emitting diodes 206, 208 and 210 are positioned behind three lenses 212, 214, 216 such that the lens 212 will be illuminated when a satisfactory one and one-half volt battery is inserted, the lens 214 will be illuminated by the light emitting diode 208 when a satisfactory nine volt battery is inserted and the lens 216 will be illuminated by the light emitting diode 210 when a satisfactory thirty-five volt battery package is inserted into the slot 180.

Referring now to FIGS. 16 and 17, there is illustrated a further form of the present invention which utilizes a system of packaging identical to that described in conjunction with FIGS. 3 to 6 and also utilizes a plate and conductive strip arrangement such as described in conjunction with the description of FIGS. 7 and 8. However, in a particular embodiment illustrated in FIGS. 16 and 17, a lamp indication is provided for a satisfactory battery. However, in this particular embodiment, a single lamp is illuminated in response to the insertion of a particular size of battery instead of the two and three lenses in the case of FIGS. 13 to 15. It is to be understood that the conductive plate may be identical to plate 92 and the terminal strips may be the terminal strips 100 through 106 described in conjunction with FIG. 7. Accordingly, corresponding reference numerals have been applied to FIG. 16. In this case, when a one and one-half battery package is inserted into the slot 30, one and one-half volts is impressed across terminals 100, 104. This will cause current to flow through a series circuit including a resistor 220 and a light emitting diode 222. On the other hand, if a nine volt battery package is inserted, nine volts will be impressed across terminals 100, 102 to cause current to flow through a series circuit including resistor 224 and light emitting diode 226. The 35 volt circuit includes terminals 106, a resistor 228 and a light emitting diode 230.

Accordingly, if a one and one-half volt battery is inserted, only the terminal 104, in addition to common terminal 100, will be energized. Thus, only light emitting diode 222 will emit light. On the other hand, the insertion of the nine volt battery will only energize light emitting diode 226 and the insertion of a 35 volt battery will only energize light emitting diode 230.

As was the case with FIG. 14, each of the series circuits has been provided with a zener diode 232, 234, 236 in order to set the lower limit above which the light emitting diodes 222, 226 and 230 will be energized. For example, as was the case with zener diode 200, the zener diode 232 could be chosen to have an avalanche voltage of approximately one and four-tenths volts. Thus, if the voltage applied across terminals 100, 104 exceeds this voltage, the light emitting diode 222 will be energized. Similarly, the zener diodes 234 and 236 are chosen to have avalanche voltages corresponding to the voltages selected for zener diodes 202 and 204, respectively.

The preferred display for the system described in conjuction with FIG. 16 is illustrated in FIG. 17 wherein a plurality of single lenses 244, 246 and 248 have been provided corresponding to the one and one-half volt, nine volt and 35 volt readings. Since only a single light emitting diode is energized for a particular battery package inserted into the slot 30, only a single lens 244, 246 and 248 will be illuminated if the battery voltage is above acceptable limits.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

I claim:

1. An electrical measuring arrangement for testing electrical components having at least a first and second terminal comprising a package for the electrical component including a body portion enclosing the electrical component, a tab portion extending from said body portion and continguous therewith, first and second electrical conductors extending from said body portion through said tab portion, said conductors extending to the exterior of said tab portion, said conductors being in contact with said first and second terminals of the electrical component, said conductors within said tab portion being spaced apart a predetermined distance in accordance with an electrical characteristic of said electrical component, and a console assembly having an indicator mounted thereon for indicating an electrical condition of the electrical component, and receptacle assembly for receiving said tab portion and operable in response to said characteristic, including circuit means within said console for connecting said first and second conductors with said indicating means in accordance with said characteristic, said tab portion of said package assembly being removably inserted within said receptacle assembly of said console and cooperating therewith in such a manner that said indicator is electrically connected to a selected portion of said circuit means and said electrical component so as to display an electrical condition thereof said circuit portion being selected by said predetermined spaced apart distance of said conductors.

2. The improvement of claim 1 wherein said console assembly includes conductive means mounted in said receptacle for electrical connection with said first and second conductors with said tab portion inserted into said receptacle.

3. The improvement of claim 2 wherein said first and second conductors are selectively spaced depending on the voltage of the electrical component.

4. The improvement of claim 2 wherein said receptacle includes two conductor means corresponding to said first and second conductors and having the same transverse spacing relative to said receptacle as said first and second conductors.

5. The improvement of claim 4 wherein said console includes an insulating plate mounted within said receptacle for supporting said conductive means, said plate further including $m$ conductive portions mounted thereon, and switch means mounted within said receptacle and adapted to be moved into engagement with at least a portion of said conductive portions in response to the insertion of said tab portion into said receptacle, $m$ being equal to the number of different power supply voltages to be tested plus one.

6. The improvement of claim 5 wherein said tab portion has length depending on the voltage of said power supply being tested.

7. The improvement of claim 6 wherein said tab portion is adapted to engage said switch means, said conductive portions being aligned longitudinally within said receptacle for engagement by said switch means.

8. The improvement of claim 7 wherein said switch means is successively moved into contact with said conductive portions as said greatest length tab portion inserted into said receptacle.

9. The improvement of claim 8 wherein said circuit means includes m impedance means connected in series across said conductor means.

10. The improvement of claim 9 wherein a first of said impedance means is connected across one of said conductive portions and one of said conductive means.

11. An electrical measuring arrangement including a console adapted to test the voltage output of batteries having a variety of intended output voltages which are contained in a package, said arrangement comprising:

a package containing a battery having a body portion enclosing said battery and a tab portion extending from said body portion;

first and second electrical conductors extending from said body portion through said tab portion to the exterior of said tab portion, said first conductor being in electrical contact with a first terminal of said battery and said second conductor being in electrical contact with a second terminal of said battery and said first and second conductors being spaced apart a predetermined distance on said tab portion;

a housing;

a voltage meter mounted in said housing;

a receptacle portion disposed in said housing, said tab portion being removably inserted in said receptacle;

an insulating plate movably disposed in said receptacle;

means urging said insulating plate in an upward direction;

a plurality of spaced apart conductive strips disposed on said insulating plate, a first and second of which have a spacing corresponding to said spaced predetermined distance of said contacts on said tab portion;

a first resistive element connected between said first and second of said plurlaity of conductive strips, said voltage meter being connected in parallel with said first resistive element in such a manner as to produce substantially full scale deflection of said voltage meter when said tab portion is inserted into said receptacle and said electrical contacts of said battery package is thereby electrically connected to said first and second conductive strips and said battery's output voltage is substantially equal to the intended output voltage thereof;

additional resistive elements connected in series with said first resistive element and other of said plurality of conductive strips in such a manner as to form a voltage divider circuit which will produce a substantially full scale deflection of said voltage meter when another tab portion is inserted into said receptacle and said electrical contacts of another of said battery packages having spaced apart conductors on said another tab portion, said conductors being spaced apart a distance other than said predetermined distance are thereby electrically connected to said first and another of said conductive strips and said another battery's output voltage is substantially equal to the intended output voltage, said another battery having an intended output voltage different than said intended output voltage of said battery.

12. An electrical measuring arrangement adapted to test the voltage output of different batteries having different intended output voltages each of which are contained in separate packages, each having a tab portion the length of which corresponds to the intended output voltage of said battery and further having a first and second spaced apart electrical contacts which communicate with the terminals of said battery, said arrangement comprising:

a package containing a battery having a body portion enclosing said battery and a tab portion contiguous with said body portion and extending outward therefrom;

first and second electrical conductors extending from said body portion through said tab portion to the exterior of said tab portion, said first conductor being in electrical contact with a first terminal of said battery, said second conductor being in contact with a second terminal of said battery and said first and second conductors being spaced apart a predetermined distance on said tab portion;

a housing;

a voltage meter mounted in said housing;

a receptacle portion disposed in said housing said tab portion being removably inserted in said receptacle;

an insulating plate movably disposed in said receptacle;

means urging said insulating plate in an upward direction;

a first and second conductive strip disposed on said insulating plate and spaced apart said predetermined distance so as to be electrically connected to said conductors on said tab portion upon insertion thereof in said receptacle;

a plurality of resistive elements connected in series between said first and second conductive strips so as to form a voltage divider circuit therebetween;

a plurality of electrical contactors disposed on said insulating plate;

a switch finger extending across said receptacle opening in such a manner as to engage the leading edge of said tab portion as it is inserted in said receptacle and to be caused to move inward in response to insertion of said tab portion, and having one terminal electrically connected to said voltage meter; and said switch finger being adapted to connect said voltage meter to one of said plurality of electrical contactors disposed on said insulating plate, each of said contactors being connected between successive of said plurality of resistive elements, said voltage meter being thereby connected in parallel with selected ones of said plurality of resistive elements, said selected ones being determined by the length of said tab portion which corresponds to the intended voltage output of said battery so as to cause said voltage meter to deflect to substantially full scale in response to the insertion of said tab portion of said battery package when said battery output voltage is substantially equal to said intended output voltage.

* * * * *